(12) United States Patent
Naiu et al.

(10) Patent No.: US 9,772,106 B2
(45) Date of Patent: Sep. 26, 2017

(54) DEVICE FOR ELECTROMAGNETIC TREATMENT OF FUELS AND METHOD FOR OPERATING THE DEVICE

(71) Applicant: Grigore Foculescu, Bucharest (RO)

(72) Inventors: Mircea Naiu, Erlangen (DE); Grigore Foculescu, Bucharest (RO); Florin Mihalache, Bucharest (RO)

(73) Assignee: Grigore Foculescu, Bucharest (RO)

( * ) Notice: Subject to any disclaimer, the term of this patent is extended or adjusted under 35 U.S.C. 154(b) by 394 days.

(21) Appl. No.: 14/676,357

(22) Filed: Apr. 1, 2015

(65) Prior Publication Data

US 2015/0285492 A1 Oct. 8, 2015

(30) Foreign Application Priority Data

Apr. 3, 2014 (CH) .......................... 527/14

(51) Int. Cl.
*H03B 1/00* (2006.01)
*F23C 99/00* (2006.01)
*C10G 32/02* (2006.01)

(52) U.S. Cl.
CPC ............ *F23C 99/001* (2013.01); *C10G 32/02* (2013.01)

(58) Field of Classification Search
CPC .......... F23C 99/001; C10G 32/02; H03B 1/00
USPC .......... 431/253, 10, 16; 422/186.04
See application file for complete search history.

(56) References Cited

U.S. PATENT DOCUMENTS

| | | | |
|---|---|---|---|
| 6,175,727 B1 | 1/2001 | Mostov | |
| 9,441,834 B2 * | 9/2016 | Colannino | ............ F23C 99/001 |
| 2003/0076199 A1 | 4/2003 | Yamaguchi | |
| 2016/0075593 A1 * | 3/2016 | Ritzberger | .............. C03C 3/095 |
| | | | 501/32 |

FOREIGN PATENT DOCUMENTS

| | | |
|---|---|---|
| GB | 2151791 | 7/1985 |
| JP | 2009293577 | 12/2009 |
| WO | 9314311 | 7/1993 |

OTHER PUBLICATIONS

Swiss Search Report of CH00527/14 dated May 12, 2014.

\* cited by examiner

*Primary Examiner* — Gregory Huson
*Assistant Examiner* — Nikhil Mashruwala
(74) *Attorney, Agent, or Firm* — Cooper & Dunham LLP

(57) ABSTRACT

A device (1) for electromagnetic treatment of fuels by means of an electromagnetic field comprises at least a resonance oscillator module (D, E, F) for generating an electric alternating field, a supply module (B) for supplying an alternating voltage to the at least one resonance oscillator module (D, E, F). The resonance oscillator module (D, E, F) comprises a plurality of oscillating circuits mutually connected, with a plurality of coils (6) and a plurality of capacitors (3, 4). Each coil (6) is formed of precisely one closed winding and each capacitor (3, 4) is connected to two coils (6) in such a way that connection points of the capacitors (3, 4) are distributed along the closed winding and are spaced from one another. Each coil (6) is connected in such a way to at least a further coil (6) that the connected coils (6) have no common capacitor connection.

13 Claims, 3 Drawing Sheets

Figure 1:
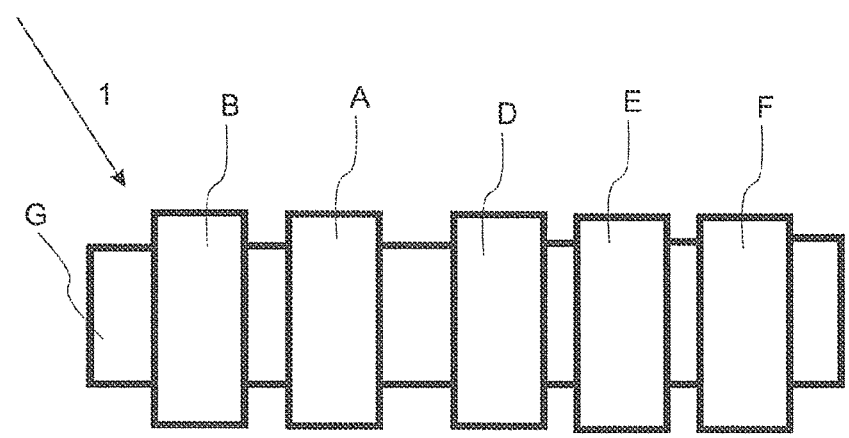

DEVICE FOR ELECTROMAGNETIC TREATMENT OF FUELS AND METHOD FOR OPERATING THE DEVICE

CROSS-REFERENCE TO RELATED APPLICATIONS

This application claims priority under 35 U.S.C. §119 of Swiss application Number 0527/14 filed Apr. 3, 2014, the entire contents of which are incorporated herein by reference.

TECHNICAL FIELD

The invention relates to a device for electromagnetic treatment of solid or liquid or gaseous fuels by means of an electric field and a method for operating the device, according to the independent claims.

BACKGROUND

Saving energy is an increasingly important topic with respect to the continuously increasing energy demand of earth's population and with respect to environmental conservation. In addition to a responsible handling of energy consuming devices and installations, saving energy comprises also measures for the devices themselves. For example, energy is saved by automatic switch off of devices if they haven't been used for some time. In other cases, like e.g. in case of heating systems, energy is also saved by an effective thermal insulation of the rooms to be heated. In case of devices being operated with fuels, energy is saved amongst others by computer-controlled fuel supply, like e.g. injection systems, etc.

DISCLOSURE OF THE INVENTION

It is the objective of the invention to improve the energy balance for systems and installations operated with solid, liquid or gaseous fuels.

This objective is reached by a device and a method for operating the device according to the independent claims.

A device for electromagnetic treatment of solid, liquid or gaseous fuels by means of an electromagnetic field is provided. The device according to the invention comprises at least a resonance oscillator module for generating an electric alternating field and a supply module for supplying an alternating voltage to the at least one resonance oscillator module. The resonance oscillator module comprises a plurality of oscillating circuits mutually connected. An entirety of the oscillating circuits comprise a plurality of coils and a plurality of capacitors. Each coil is formed of precisely one closed winding and each capacitor is connected to two coils in such a way that connection points of the capacitors are distributed along the closed winding and are spaced from one another. Each coil is connected in such a way to at least a further coil that the connected coils have no common capacitor connection.

The method for operating the device according to the invention comprises the steps of:
  determining a number of the resonance oscillator modules to be used and connecting the resonance oscillator modules,
  choosing a frequency spectrum, based on an aggregate state of the fuel, for a first and/or a second and/or a third frequency of the alternating voltage, wherein the first, second and third frequency are each a frequency component of the frequency spectrum,
  adjusting the device for generating this frequency; and
  switching on the device for generating the electromagnetic alternating field.

The device according to the invention may be used for all installations operated with fuels, preferably for coal power stations, fuel oil burners, gas power stations, combustion motors, and industrial ovens.

The fuels, the caloric energy of which may be increased by the device according to the invention, comprise coal, heating oil, methane gas, diesel, gasoline, kerosene, etc.

It has been found that the idle energy of fuel molecules is changed with respect to chemical composition by subjecting it to an alternating electromagnetic field with a high frequency spectrum. In other words it is possible to facilitate the chemical binding between oxygen and the fuel molecules because the electron affinity for other electrons, particularly for oxygen electrons, increases.

Because of the influence of the alternating electromagnetic field generated by the device according to the invention, the fuel molecules, onto which the energy of the alternating field acts by means of circular polarised waves, which on their turn change the energy levels of the electrons of the fuel molecules, lead to a change of quantum numbers defining the entire energy of the atoms of the treated fuel. As a result, the calorific value or the calorific energy of the fuel is increased, thus leading to a more efficient use of the fuel. In other words it is possible in this way to use less fuel for the same result. The optimization of the calorific value created by the device results in fuel savings in the two-digit percent range.

SHORT DESCRIPTION OF THE DRAWINGS

Figure 2:
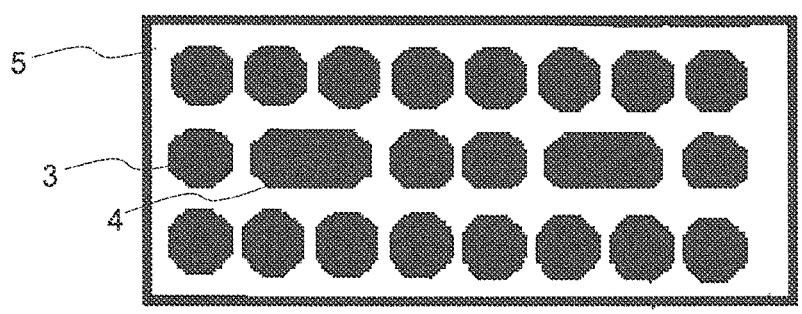
Figure 3:
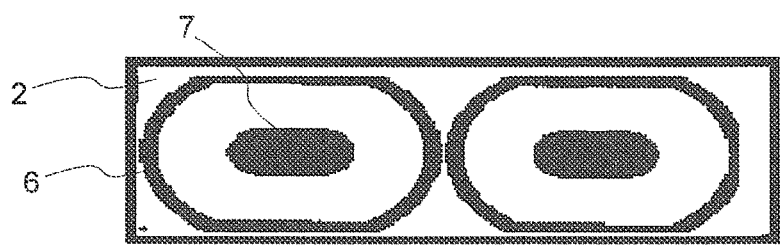
Figure 4:
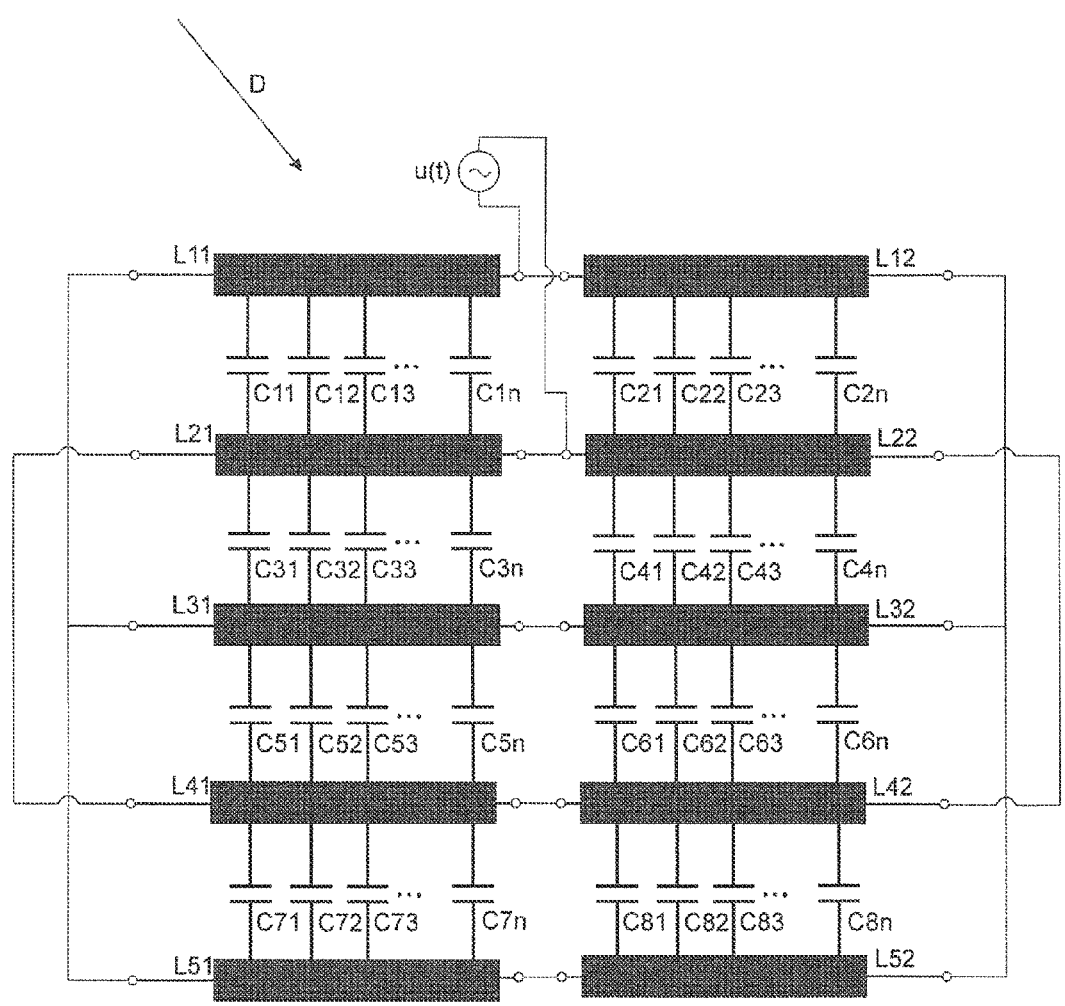
Figure 5:
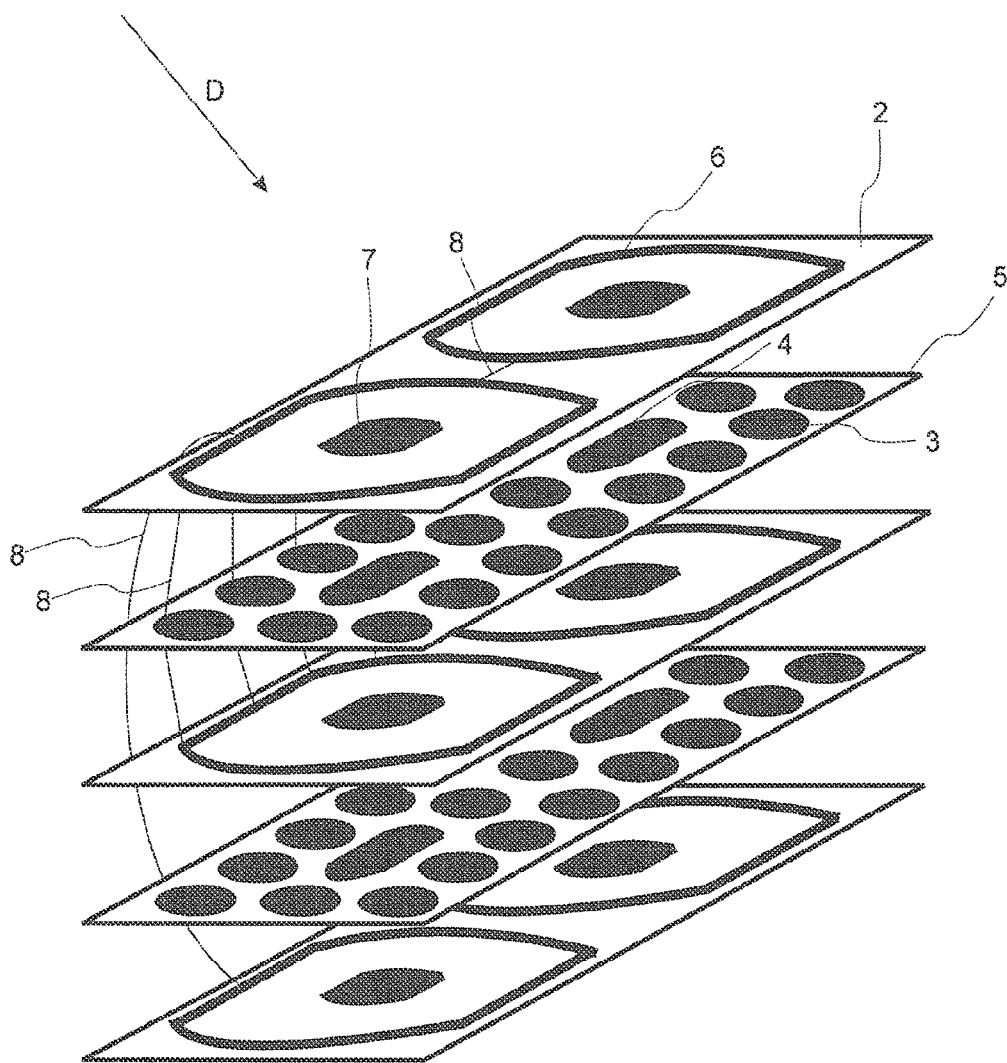

Further embodiments, advantages and applications of the invention result from the dependent claims and from the now following description by means of the figures. Thereby it is shown in:

FIG. 1 a block diagram of the device according to the invention,

FIG. 2 a top view on a first glass textolite plate of a resonance oscillator module of the device according to the invention, FIG. 3 a top view on a second glass textolite plate of the resonance oscillator module, FIG. 4 a schematic of the resonance oscillator module; and FIG. 5 a simplified perspective view of an exemplary resonance oscillator module in one implementation.

WAYS OF CARRYING OUT THE INVENTION

In the following same references denote same elements of the embodiments of the invention with respect to structure and/or function.

It is noted that the term "oxygen atom" is understood in the context of the present document because of simplicity reasons as generic term for oxygen compounds. Combustion processes with pure oxygen (atoms), e.g. in chemical industrial installations, as well as combustion with air (molecules), e.g. household heating oil burners, are included.

In the context of this document the term "substantially elliptic" or "substantially elliptical shape" is to be understood to the extent that the shape can vary at most 40%, with respect to the major axis and/or the minor axis of the ellipse, from the shape of the ellipse.

FIG. 1 shows a block diagram of the device according to the invention. It comprises a frequency modulator A, a supply module B and three resonance oscillator modules D, E, F.

The number of the resonance oscillator modules is chosen exemplarily here. In general, operation is possible with at least a single resonance oscillator module D. The number of resonance oscillator modules D-F depends on the quantity of the fuel to be treated. The larger the quantity of the fuel to be burnt per time unit, the more resonance oscillator modules D-F are necessary in order to provide the required energy for the molecular influence on the fuel molecules and oxygen atoms. The number of resonance oscillator modules D-F is a step function of the fuel quantity. This is understood in the context of the present document in such a way that for a linear increase of the fuel quantity the number of resonance oscillator modules is incremented by 1 starting with a certain quantity value. The predefined value depends on the desired efficiency level of the device. If e.g. a fuel quantity is considered, for which a barely acceptable efficiency level is reached with a single resonance oscillator module, it is advantageous to add another resonance oscillator module in order to increase the efficiency level by supplying more energy.

Preferably, the device 1 comprises attaching means G for adding or removing resonance oscillator modules. The attaching means G comprise particularly an attaching frame 2, which may e.g. be a U-shaped profile, and electric contacts (not shown), preferably embedded in the attaching frame, for electrically connecting the resonance oscillator modules to the supply module B and the frequency modulator A. By embedding the electric contacts in the attaching frame the risk of electric shock is minimized. The attaching frame is made by a steel sheet or another suitable material and is dimensioned with respect to sheet thickness and shape in such a way that it is resistant against bending when considering the weight of the modules fitted thereon.

In a preferred embodiment detecting electronics are provided, which determine the number of resonance oscillator modules and transmit it to a controller of the supply module. In this way an automatic adjustment of the energy required for supplying all modules by the supply module B is reached. The device uses a voltage between 5000 V and 8000 V. It is understood that the supply module also supplies a current which is sufficient for the optimum operation of the resonance oscillator modules.

Preferably, the at least one resonance oscillator module and/or the supply module and/or the to frequency modulator are cast in epoxy resin. This has the advantage that the device or its modules, respectively, are protected from dust and humidity. Particularly, an epoxy resin which is resistant to high temperatures and breakdown voltages is used.

As mentioned above, the frequency modulator A controls the resonance oscillator modules D-F with a frequency which can be chosen from a first, a second and a third frequency, depending if the fuel to be treated is solid, liquid or gaseous. The first frequency is a frequency component of a frequency spectrum ranging between 25 and 100 GHz, the second frequency is a frequency component of a frequency spectrum ranging between 15 and 25 GHz and the third frequency is a frequency component of a frequency spectrum ranging between 1 and 90 GHz. It is specifically noted that the device also functions without frequency modulator A, if a suitable waveform of the input voltage u(t) (FIG. 4) is provided.

Preferably, the resonance oscillator module comprises at least two glass textolite plates, each belonging to a first or a second group.

FIG. 2 shows a top view on a first glass textolite plate 2 of the resonance oscillator modules D-F. The glass textolite plate 2 is coated with a layer of electrolyte copper (99.99%) on one side or on both sides on at least a section of the surface. The coated section may comprise at least an octagonal surface 3 and at least an elongated octagonal surface 4, wherein here exemplarily twenty octagonal surfaces 3 and two elongated octagonal surfaces 4 are provided. The elongated octagonal surfaces 4 are surrounded by the octagonal surfaces 3. Other shapes, e.g. circular surfaces 3 (see FIG. 5), may also be used.

FIG. 3 shows a top view on a second glass textolite plate 5 of the resonance oscillator modules D-F. The second glass textolite plate 5 is also coated with a layer of electrolyte copper (99.99%) on one side or on both sides on at least a section of the surface. The coated section is formed by two annular surfaces 6. As seen in FIG. 3, the annular surfaces have a substantially elliptic shape, wherein the upper and the lower extremities are plane. Inside each annular surface 6 a metallised opening 7 is provided for electrically connecting the annular surfaces 6.

The coated octagonal surfaces 3 and 4 of the first glass textolite surface 2 are electrically connected with the coated annular sections 6 of the second glass textolite plate 5 by means of a plurality of electrically conductive wires. This will be described in more detail in connection with FIG. 5.

FIG. 4 shows a schematic of the resonance oscillator module and FIG. 5 a simplified perspective view of an exemplary resonance oscillator module in one implementation. In the following, both figures are described together due to simplification reasons. As can particularly be seen in FIG. 5, the circuitry is a "three-dimensional" circuitry, because not only individual components (coils) of individual planes (circuit boards) are electrically interconnected, but also components of neighbouring planes and the planes themselves with one another. The resonance oscillator modules D, E, F is mounted sandwich-like. Between each two circuit boards 2 of the first group a circuit board 5 of the second group is arranged. Preferably, five circuit boards 2 of the first group and 4 circuit boards 5 of the second group are provided, wherein FIG. 5 only shows five circuit boards altogether, because of simplicity reasons.

When the figures are seen in conjunction, the coils L11 and L12 (FIG. 4) correspond to the coils 6 of the uppermost circuit boards 2 of FIG. 5 and the capacitors C11-C1$n$ or C21-C2$n$, respectively, (FIG. 4) correspond to the capacitors 3 of the second plane (FIG. 5) etc. Coils L11, L31, L51 or L21 and L41, respectively, are connected to one another. In the same way, coils L12, L32, L52 or coils L22 and L42, respectively, are connected to one another. Furthermore, the coils of each circuit board (e.g. L11 and L12) are connected to one another.

The input voltage u(t) is applied between the connection of the coils of one of the circuit boards and the connection of the coils of a second circuit board. As mentioned above, the input voltage u(t) (5000-8000V) may either be provided directly from the supply module B or from the frequency modulator A and is applied between two of the circuit boards of the first group, as can be seen in FIG. 4.

The connections 8 between the circuit boards are shown in FIG. 5 in a schematic way and incomplete in order to retain clarity of the figure. The sections which are coated with electrolyte copper are illustrated by the thick lines or black surfaces, respectively. The circuit boards 2 of the first group are coated on one side. The coated section of the circuit boards 2 may comprise at least one coil, wherein two coils are provided in this example. The closed winding is formed by an annular surface 6. The circuit boards 5 with the capacitors are coated on both sides. The coated sections 3 of the circuit boards 5 shown in FIG. 5 are attributed to corresponding coated sections on the other side of the circuit boards 5 (not visible), in such a way that each two coated sections attributed to one another form a capacitor 3. Preferably, the coated sections attributed to one another either have a first or a second shape. Particularly, the capacitors 3 of the first shape surround the capacitors 4 of the second shape. The first shape may be octagonal, hexagonal or circular. The second shape may be an elliptic surface 4 which is plane in the area of the minor vertices. It is understood that the capacitors and the coils may have other shapes than the exemplary ones described here.

Preferably, twenty capacitors of the first shape and two capacitors of the second shape are provided per circuit boards. Each capacitor 3 is electrically connected to a coil of the two neighbouring circuit boards 2 of the first group.

In the following, the operation of the device 1 is described. It is noted that the resonance oscillator module D, E, F is preferably formed in such a way that the alternating electromagnetic field generated by it is circularly polarised. Furthermore, in embodiments, the resonance oscillator module may be supplied with energy from the supply module in such a way that the alternating electromagnetic field generated by the resonance oscillator module has an energy suitable for exciting fuel molecules or fuel atoms or electrons, respectively.

First, the number of resonance oscillator modules D, E, F to be used is determined. As mentioned above this step depends on the power to be generated, which itself depends on the fuel quantity to be treated. Subsequently the determined resonance oscillator modules D, E, F are built in and connected. They may be formed as plug-in modules, such that they can be plugged in or out of the frame provided with contacts. After that, a frequency spectrum for the first and/or the second and/or the third frequency of the alternating voltage is chosen by taking into account the aggregate state of the fuel, wherein the first, second and third frequency are each a frequency component of the respective frequency spectrum.

It is noted that the device according to the invention may on the one hand be used directly for treating the fuel, however it may also influence the fuel during the oxidation phase (burning), if suitably placed. In other words, the device can act on a flame and positively influence the burning process itself. The term "suitably placed" is understood as finding an optimum distance of the device from the flame. This depends on the spatial setup of the installation in which the device is used and is normally an experimental value.

For example, the electromagnetic field generated by the resonance oscillator module may be such that a carrier frequency of 50 Hz is modulated with the high-frequency spectrum, in other words with the variable first and/or second and/or third frequency. This is particularly advantageous in case the fuel and/or the flame are located in a substantially closed metal container, such that potential Faraday-cage effects are overcome due to the 50 Hz carrier frequency. It is preferred to place the device according to the invention in the area of the inlet of the fuel in order to reach a minimum attenuation of the modulated frequencies.

In the following, two tables are provided, showing experimental values illustrating the effect of the device according to the invention for electromagnetic treatment of fuels. Table 1 contains values measured without the device according to the invention, whereas table 2 shows values with the device according to the invention.

The experiments are based on heating water in a container by means of an oil heating, wherein suitable temperature sensors, flow sensors, etc. have been used for data acquisition. The regulation and data processing were carried out with a SCADA-system by Siemens AG. It was attempted to keep input variables like input water temperature and flow as equal as possible. Deviations of these values cannot be avoided because of the high throughput of water. The measurement series was initiated at 19:00 or at 18:30 hours, respectively and values were acquired every 30 minutes. The last column shows the water quantity per gigacalorie. When comparing the two tables it is evident that without the device according to the invention a mean value of 131.46 m$^3$ water corresponds to one gigacalorie, whereas with the device according to the invention a mean value of 107.26 m$^3$ water correspond to one gigacalorie. Consequently water could be heated in a more efficient way with the device according to the invention.

TABLE 1

| Time | Water temp. input container | Water temp. output container | ΔT | Flow water in tons | Gcal hour | m$^3$/Gcal |
|---|---|---|---|---|---|---|
| 19.00 | 78 | 100 | 22 | 2000 | 44.00 | 136.36 |
|  | 77 | 95 | 19 | 2000 | 38.00 | 131.58 |
|  | 76 | 92 | 16 | 2400 | 38.40 | 130.21 |
|  | 76 | 92 | 16 | 2400 | 38.40 | 130.21 |
|  | 74 | 90 | 16 | 2400 | 38.40 | 130.21 |
|  | 74 | 90 | 16 | 2400 | 38.40 | 130.21 |
| Mean | 75.83 | 93.16 | 17.5 | 2266.66 | 39.26 | 131.46 |

TABLE 2

| Time | Water temp. input container | Water temp. output container | ΔT | Flow water in tons | Gcal hour | m$^3$/Gcal |
|---|---|---|---|---|---|---|
| 18.30 | 79.00 | 99.00 | 20 | 1900 | 38.00 | 106.58 |
|  | 78.00 | 98.00 | 20 | 1899 | 38.00 | 106.58 |
|  | 77.00 | 96.00 | 19 | 2000 | 38.00 | 106.58 |
|  | 77.00 | 95.00 | 18 | 2050 | 36.90 | 109.76 |
|  | 76.00 | 93.00 | 17 | 2230 | 37.91 | 106.83 |
| Mean | 77.6 | 96.2 | 16.8 | 2015.8 | 37.76 | 107.26 |

While preferred embodiments of the invention are described in the present patent application, it is clearly noted that the invention is not limited to these embodiments but can also be carried out in different ways within the scope of the following claims. Therefore terms like "preferably", "particularly", "advantageously", etc. relate solely to optional and exemplary embodiments.

The invention claimed is:

1. A device (1) for electromagnetic treatment of fuels by means of an electromagnetic field, comprising:
   at least a resonance oscillator module (D, E, F) for generating an electric alternating field,
   a supply module (B) for supplying an alternating voltage to the at least one resonance oscillator module (D, E, F),
   characterized in that the resonance oscillator module (D, E, F) comprises a plurality of oscillating circuits mutually connected, wherein an entirety of the oscillating circuits comprise a plurality of coils (6) and a plurality of capacitors (3, 4), wherein each coil (6) is formed of precisely one closed winding and each capacitor (3, 4) is connected to two coils (6) in such a way that connection points of the capacitors (3, 4) are distributed along the closed winding and are spaced from one another, wherein each coil (6) is connected in such a way to at least a further coil (6) that the connected coils (6) have no common capacitor connection;

wherein the resonance oscillator module (D, E, F) comprises a plurality of circuit boards (2, 5), particularly glass textolite plates, which are coated on at least a section of their surface with a layer of an electrically conducting material, particularly electrolyte copper, wherein the circuit boards (2, 5) are attributed to a first or a second group of circuit boards, wherein the circuit boards (2) of the first group are coated one side or on both sides and the circuit boards (5) of the second group are coated on both sides.

2. The device according to claim 1, wherein the supply module (B) is structured and formed in such a way that the alternating voltage generated by it has a first and/or a second and/or a third frequency.

3. The device according to claim 1, wherein a frequency modulator (A) is provided, being connected between the supply module (B) and the at least one resonance oscillator module (D, E, F) and being structured and formed in such a way that it modulates the alternating voltage generated by the supply module (B) with a first and/or a second and/or a third frequency.

4. The device according to claim 2, wherein the supply module (B) is adapted to generate the alternating voltage with the first frequency being a frequency component of a frequency spectrum between 25 and 100 GHz, the second frequency being a frequency component of a frequency spectrum between 15 and 25 GHz and the third frequency being a frequency component of a frequency spectrum between 1 and 90 GHz.

5. The device according to claim 1, wherein the coated section of the circuit boards (2) of the first group forms at least one coil (6), particularly two coils (6), particularly wherein the closed winding is formed by an annular surface, particularly having a substantially elliptic shape.

6. The device according to claim 1, wherein coated sections on one side of the circuit boards (5) of the second group are attributed to corresponding coated sections on the other side of the circuit boards (5) of the second group, in such a way that every two coated sections attributed to one another form one of the capacitors (3, 4).

7. The device according to claim 5, wherein the resonance oscillator module (D, E, F) is sandwich-shaped, wherein a circuit board (5) of the second group is arranged between two circuit boards (2) of the first group, particularly wherein five circuit boards (2) of the first group and four circuit boards (5) of the second group are provided.

8. The device according to claim 7, wherein each capacitor (3, 4) is electrically connected with a coil (6) of each one of the two neighbouring circuit boards (2) of the first group.

9. The device according to claim 7, wherein the alternating voltage is applied between two of the circuit boards (2) of the first group.

10. The device according to claim 6, wherein the coated sections attributed to one another have either a first or a second shape, particularly wherein the capacitors (3) of the first shape surround the capacitors (4) of the second shape and the first shape is an octagonal, hexagonal or circular surface and the second shape is a substantially elliptic surface, particularly wherein twenty capacitors (3) of the first shape and two capacitors (5) of the second shape are provided on one circuit board (5).

11. A method for operating a device (1) according to claim 1, comprising the steps of:
 determining a number of the resonance oscillator modules (D, E, F) to be used and connecting the resonance oscillator modules (D, E, F); subsequently
 choosing a frequency spectrum, based on an aggregate state of the fuel, for a first and/or a second and/or a third frequency of the alternating voltage, wherein the first, second and third frequency are each a frequency component of the frequency spectrum,
 adjusting the device for generating this frequency; and
 switching on the device (1) for generating the electromagnetic alternating field.

12. The method according to claim 11, wherein a plurality of resonance oscillator modules (D, E, F) are provided, particularly wherein the number of the resonance oscillator modules (D, E, F) is determined as step function of the fuel quantity.

13. Use of the device (1) according to claim 1 for coal power stations, fuel oil burners, gas power stations, combustion motors, industrial ovens.

* * * * *